United States Patent
Lee et al.

(10) Patent No.: US 12,052,822 B2
(45) Date of Patent: Jul. 30, 2024

(54) ELECTRONIC DEVICE INCLUDING HOST BOX AND ONE OR MORE EXTENSION BOXES

(71) Applicants: Samsung Electronics Co., Ltd., Suwon-si (KR); SNU R&DB Foundation, Seoul (KR)

(72) Inventors: Seung Wook Lee, Suwon-si (KR); Jangwoo Kim, Seoul (KR); Pyeongsu Park, Seoul (KR)

(73) Assignees: Samsung Electronics Co., Ltd., Suwon-si (KR); Seoul National University R&DB Foundation, Seoul (KR)

( * ) Notice: Subject to any disclaimer, the term of this patent is extended or adjusted under 35 U.S.C. 154(b) by 409 days.

(21) Appl. No.: 17/375,307

(22) Filed: Jul. 14, 2021

(65) Prior Publication Data
US 2022/0225506 A1    Jul. 14, 2022

(30) Foreign Application Priority Data

Jan. 13, 2021 (KR) .................. 10-2021-0004711

(51) Int. Cl.
*G06F 9/54* (2006.01)
*G06F 9/50* (2006.01)
(Continued)

(52) U.S. Cl.
CPC ............ *H05K 1/14* (2013.01); *G06F 9/5027* (2013.01); *G06F 9/54* (2013.01); *H05K 1/0213* (2013.01); *H05K 2201/047* (2013.01)

(58) Field of Classification Search
None
See application file for complete search history.

(56) References Cited

U.S. PATENT DOCUMENTS 6,983,357 B2   1/2006   Poff et al.
7,577,799 B1   8/2009   Howard et al.
(Continued)

FOREIGN PATENT DOCUMENTS

KR    10-0880300 B1    1/2009
KR    10-0932038 B1    12/2009
(Continued)

OTHER PUBLICATIONS

Park, Pyeongsu, Heetaek Jeong, and Jangwoo Kim. "TrainBox: An Extreme-Scale Neural Network Training Server Architecture by Systematically Balancing Operations." *2020 53rd Annual IEEE/ACM International Symposium on Microarchitecture (Micro)*. IEEE, 2020. (40 pages in English).

*Primary Examiner* — Scott C Sun
(74) *Attorney, Agent, or Firm* — NSIP Law

(57) ABSTRACT

An electronic device includes: a host box comprising a host processor configured to control an operation of the electronic device, a host motherboard in which the host processor is disposed, and a host power supply unit (PSU) configured to supply power to a component connected to the host motherboard; and one or more extension boxes controlled by the host box, wherein each of the one or more extension boxes comprises an extension motherboard independent of the host box, and an extension PSU independent of the host box and configured to supply power to a component connected to the extension motherboard.

19 Claims, 6 Drawing Sheets

(51) Int. Cl.
*H05K 1/02* (2006.01)
*H05K 1/14* (2006.01)

(56) References Cited

U.S. PATENT DOCUMENTS

| | | |
|---|---|---|
| 7,899,913 B2 | 3/2011 | Minami et al. |
| 7,979,526 B2 | 7/2011 | Minami et al. |
| 9,098,297 B2 | 8/2015 | Poff et al. |
| 9,495,723 B2 | 11/2016 | Currid et al. |
| 2014/0016259 A1* | 1/2014 | Shih ................... G06F 1/263 361/679.31 |
| 2015/0042664 A1 | 2/2015 | Currid et al. |
| 2018/0113822 A1* | 4/2018 | Pronozuk ............ G06F 13/1694 |

FOREIGN PATENT DOCUMENTS

| | | |
|---|---|---|
| KR | 10-0950814 B1 | 4/2010 |
| KR | 10-1980190 B1 | 5/2019 |
| KR | 10-2043487 B1 | 11/2019 |

* cited by examiner

ELECTRONIC DEVICE INCLUDING HOST BOX AND ONE OR MORE EXTENSION BOXES

CROSS-REFERENCE TO RELATED APPLICATIONS

This application claims the benefit under 35 USC § 119(a) of Korean Patent Application No. 10-2021-0004711 filed on Jan. 13, 2021, in the Korean Intellectual Property Office, the entire disclosure of which is incorporated herein by reference for all purposes.

BACKGROUND

1. Field

The following description relates to an electronic device including a host box and one or more extension boxes.

2. Description of Related Art

Independent hardware solely for artificial intelligence (AI) is insufficient. AI may perform inference and learning through operations. Hardware dedicated to the implementation of AI is insufficient.

Such dedicated hardware for AI may be embodied by, for example, a central processing unit (CPU) and a graphics processing unit (GPU), or by a field-programmable gate array (FPGA) and an application-specific integrated circuit (ASIC) that may be repurposed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electronic device includes: a host box comprising a host processor configured to control an operation of the electronic device, a host motherboard in which the host processor is disposed, and a host power supply unit (PSU) configured to supply power to a component connected to the host motherboard; and one or more extension boxes controlled by the host box, wherein each of the one or more extension boxes comprises an extension motherboard independent of the host box, and an extension PSU independent of the host box and configured to supply power to a component connected to the extension motherboard.

Each of the one or more extension boxes further may include a controller independent of the host processor and configured to control an operation of the component connected to the extension motherboard.

The controller may be configured to perform any one or any combination of any two or more of device management based on a device driver of a corresponding extension box, input and output data management for the corresponding extension box, and processing of data stored in a storage.

At least one of the one or more extension boxes further may include a data storage device, and data stored in the data storage device is transferred to an accelerator included in the at least one of the one or more extension boxes by a controller included in the at least one of the one or more extension boxes.

The host memory included in the host box may be excluded from a transfer path of the data.

Each of the one or more extension boxes further may include an extension switch configured to communicate with the host box and one or more of the one or more extension boxes disposed adjacent to the extension box among the one or more extension boxes.

A component included in each of the one or more extension boxes may be determined based on either one or both of a data communication pattern of a workload performed in the electronic device and a bandwidth of an extension switch included in each of the one or more extension boxes.

The data communication pattern may be a pattern in which data transferred from a storage is processed by a controller and is the processed data is transferred to an accelerator.

A connection structure of the host box and the one or more extension boxes may be a tree structure having the host box as a root node.

A component included in each of the one or more extension boxes may be determined based on any one or any combination of any two or more of reading performance of a storage, data processing performance of a controller, and processing performance of an accelerator, and on a physical limitation of a corresponding extension box.

In another general aspect, an electronic device includes: a host box comprising a host processor configured to control an operation of the electronic device, a host motherboard in which the host processor is disposed, and a host power supply unit (PSU) configured to supply power to a component connected to the host motherboard; and one or more extension boxes controlled by the host box, wherein each of the one or more extension boxes may include an extension motherboard independent of the host box, and a controller independent of the host processor and configured to control an operation of a component connected to the extension motherboard.

The controller may be configured to perform any one or any combination of any two or more of device management based on a device driver of a corresponding extension box, input and output data management for the corresponding extension box, and processing of data stored in a storage.

Each of the one or more extension boxes further may include an extension PSU independent of the host box and configured to supply power to the component connected to the extension motherboard.

At least one of the one or more extension boxes further may include a data storage device, and data stored in the data storage device may be transferred to an accelerator included in the at least one of the one or more extension boxes by a controller included in the at least one of the one or more extension boxes.

Each of the one or more extension boxes further may include an extension switch configured to communicate with the host box and one or more of the one or more extension boxes disposed adjacent to the extension box among the one or more extension boxes.

A connection structure of the host box and the one or more extension boxes may be a tree structure having the host box as a root node.

In another general aspect, an electronic device includes: a host box comprising a host processor configured to control an operation of the electronic device, a host motherboard in which the host processor is disposed, and a host power supply unit (PSU) configured to supply power to a component connected to the host motherboard; and one or more extension boxes controlled by the host box, wherein at least one of the one or more extension boxes may include a data storage device, and wherein data stored in the data storage device is transferred to an accelerator included in the at least one of the one or more extension boxes by a controller included in the at least one of the one or more extension boxes.

Each of the one or more extension boxes may include: an extension motherboard independent of the host box; and an extension PSU independent of the host box and configured to supply power to a component connected to the extension motherboard.

In another general aspect, an electronic device includes: a host box comprising a host processor configured to control one or more operations of extension boxes; and the extension boxes each comprising an accelerator and any one or any combination of any two or more of an extension motherboard, an extension power supply unit (PSU), a controller, and a data storage device.

The extension boxes each may include the extension motherboard, and the extension motherboard may be configured to expand a number of slots included in the electronic device independent of a number of slots included in a host motherboard of the host box.

Each of the extension boxes may include an extension switch configured to communicate with the host box and one or more of the more extension boxes disposed adjacent to the extension box a tree structure of the electronic device.

The tree structure may be based on either one of a peripheral component interconnect (PCI) express (PCIe), and a compute express link (CXL).

The accelerators may be configured to perform a neural network operation in response to a control by the host processor.

Other features and aspects will be apparent from the following detailed description, the drawings, and the claims.

Figure 1:
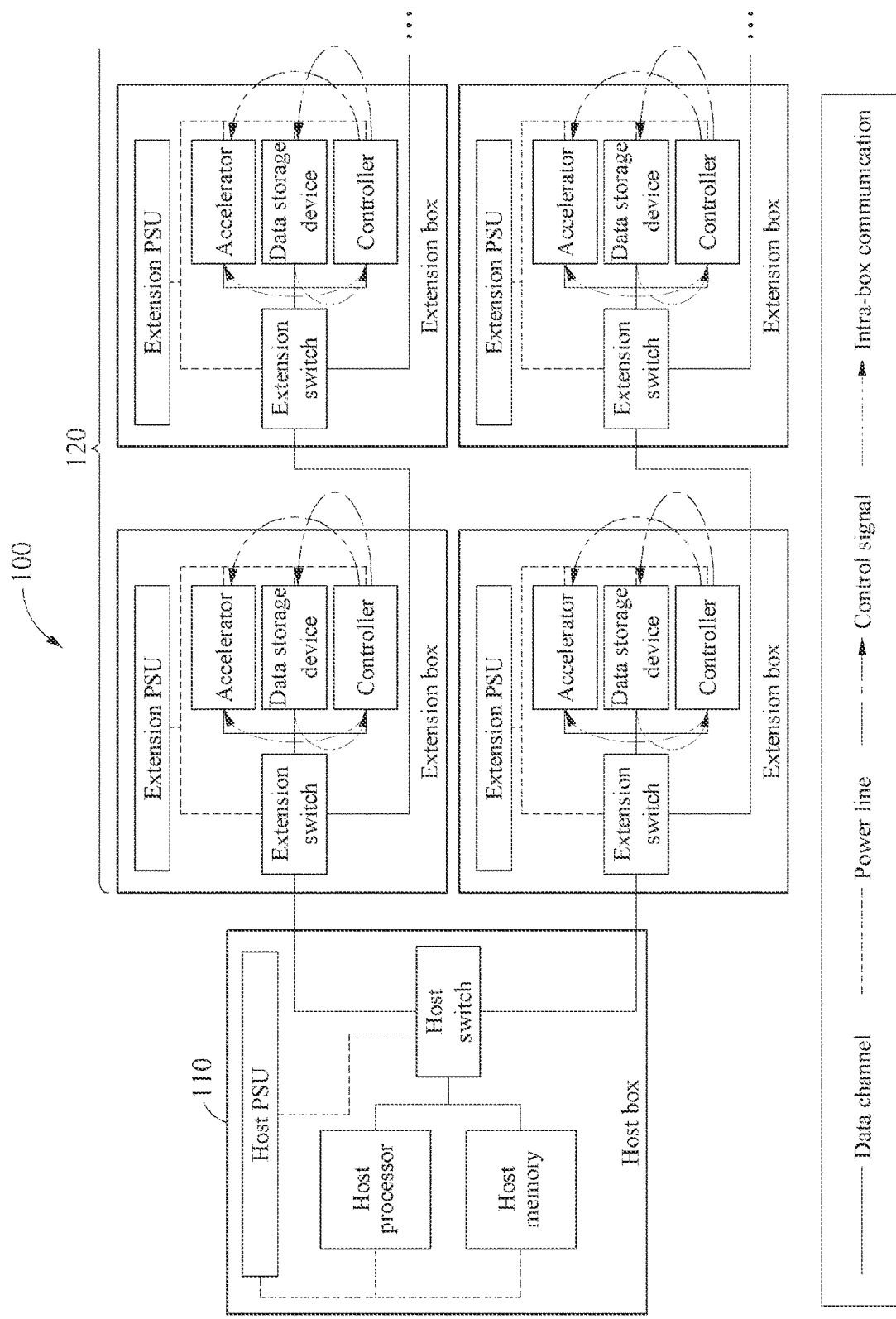
FIG. 1 illustrates an example of a single node-based electronic device.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known, after an understanding of the disclosure of this application, may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular examples only and is not to be limiting of the present disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, integers, steps, operations, elements, components, numbers, and/or combinations thereof, but do not preclude the presence or addition of one or more other features, integers, steps, operations, elements, components, numbers, and/or combinations thereof. The use of the term "may" herein with respect to an example or embodiment (for example, as to what an example or embodiment may include or implement) means that at least one example or embodiment exists where such a feature is included or implemented, while all examples are not limited thereto.

Throughout the specification, when a component is described as being "on," "connected to," or "coupled to" another component, it may be directly "on," "connected to," or "coupled to" the other component, or there may be one or more other components intervening therebetween. In contrast, when an element is described as being "directly on," "directly connected to," or "directly coupled to" another element, there can be no other components intervening therebetween. Likewise, similar expressions, for example, "between" and "immediately between," and "adjacent to" and "immediately adjacent to," are also to be construed in the same way.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein.

Also, in the description of example embodiments, detailed description of structures or functions that are thereby known after an understanding of the disclosure of the present application will be omitted when it is deemed that such description will cause ambiguous interpretation of the example embodiments. Hereinafter, examples will be described in detail with reference to the accompanying drawings, and like reference numerals in the drawings refer to like elements throughout.

FIG. 1 illustrates an example of a single node-based electronic device.

Referring to FIG. 1, a single node-based electronic device 100 may include a host box 110 and one or more extension boxes 120. The electronic device 100 may be configured as a single node in which a host processor controls and/or manages a plurality of accelerators. The electronic device 100 of one or more embodiments configured as a single node may be easier to manage, use lower costs, and exhibit a higher level of performance, compared to a typical electronic device configured as a plurality of nodes. The electronic device 100 of one or more embodiments configured as a single node may include the host box 110 and the one or more extension boxes 120 that are connected through switches, and may thus effectively overcome a constraint on the number of hardware components that the electronic device 100 may include therein.

The host box 110 may include a host processor, a host memory, a host motherboard, a host power supply unit (PSU), and a host switch, and may control the extension boxes 120.

The host processor may be a device configured to control respective operations of the electronic device 100 and components included in the electronic device 100 and may include a central processing unit (CPU), for example. The host processor may control operations of various components included in the electronic device 100 according to an operating system (OS). For example, when one or more requests for executing a neural network in one or more accelerators are received, the host processor may transfer an instruction corresponding to the received requests to the accelerators. Here, a request may be made for neural network learning or a neural network-based inference. The neural network may include a model that performs, for example, pattern recognition (e.g., object recognition, facial identification, etc.), sequence recognition (e.g., speech recognition, gesture recognition, handwritten text recognition, machine translation, machine interpretation, etc.), control (e.g., vehicle control, processor control, etc.), recommendation services, decision making, medical diagnosis, financial applications, data mining, and/or the like. However, examples of the neural network are not limited thereto.

The host memory may be a memory disposed outside an accelerator, for example, a dynamic random-access memory (DRAM). The host memory may store inference target data and/or some or all parameters of a neural network to be executed in the accelerator, and the stored data may be transferred to the accelerator for a subsequent inference to be performed.

The host motherboard may be a device configured to connect the components (e.g., the host processor, the host memory, the host switch, etc.) included in the host box 110 and enable a data exchange therebetween. The host motherboard may include a preset number of slots according to a construction and/or configuration, and the components included in the host box 110 may be arranged in the slots. The number of components included in the host box 110 may be determined by the number of slots of the host motherboard. Although non-limiting examples are to be described in detail, each of the extension boxes 120 may include an extension motherboard independent of the host motherboard, thereby improving the expandability of the electronic device 100.

The host PSU may supply power to a component connected to the host motherboard. Although non-limiting examples are to be described hereinafter, each of the extension boxes 120 may include an extension PSU independent of the host PSU, thereby improving the expandability of the electronic device 100.

The host switch may communicate with one extension switch or two or more extension switches disposed nearby the host switch among the extension boxes 120 to exchange data (e.g., one or more extension switches disposed more adjacent to the host switch than other extension switches, among extension switches of the extension boxes 120). Through such data exchange between switches, a connection structure between the host box 110 and the extension boxes 120 may have a high degree of freedom.

Each of the extension boxes 120 may include an extension motherboard, a controller, an extension PSU, and an extension switch, and may further include one or a combination of two of an accelerator and a data storage device.

The extension motherboard may be a device configured to connect components (e.g., the controller, the extension switch, the accelerator, the data storage device, etc.) included in a corresponding extension box to enable a data exchange therebetween. The extension motherboard may include a preset number of slots according to a construction and/or configuration, and the components included in the extension box may be arranged in the slots. That is, the number of components in the corresponding extension box may be determined by the number of slots of the extension motherboard. The extension boxes 120 may include separate extension motherboards having the same or different numbers of slots. Thus, the number of components included in the electronic device 100 may not be restricted.

The controller may be a device configured to control respective operations of components included in a corresponding extension box, and onto which some functions of the host processor included in the host box 110 are offloaded. The controller may control the extension box, in place of some operations of the host processor, such that the expandability of the electronic device 100 is not restricted by the performance of the host processor. For example, the controller may perform device management based on a device driver for the extension box, input and output data management, data processing, and/or the like, and be embodied by a CPU, a graphics processing unit (GPU), a field-programmable gate array (FPGA), an application-specific integrated circuit (ASIC), and/or the like according to the purpose and situation of the corresponding extension box.

The extension PSU may supply power to a component connected to the extension motherboard. The extension PSU may be a power supply device independent of the host PSU in the host box 110, with which the expandability of the electronic device 100 may not be limited to the host PSU.

The extension switch of one of the extension boxes 120 may communicate with the host box 110 and one extension switch or two or more extension switches disposed nearby the extension switch (e.g., disposed more adjacent to the extension switch) among the other extension boxes 120 to exchange data therebetween. The host box 110 and the extension boxes 120 may be of a tree structure having the host box 110 as a root node, non-limiting examples of which will be described in detail hereinafter.

Each of the extension boxes 120 may include components that are determined based on one or a combination of a data communication pattern of a workload performed in the electronic device 100 and a bandwidth of an extension switch, thereby fully maximizing intra-box communication in an extension box and minimizing inter-box communication between extension boxes. Thus, the electronic device 100 of one or more embodiments may effectively reduce the pressure on an upper node (that is, the host box 110) of a network tree.

At least one of the extension boxes 120 may further include one or a combination of an accelerator and a data storage device.

The accelerator may be a hardware device configured to execute a neural network, and may be a separate processor distinguished from the host processor described above. The accelerator may be, for example, a neural processing unit (NPU), a GPU, a tensor processing unit (TPU), a digital signal processor (DSP), or the like.

The accelerator may process a workload or an operation that is more effectively processed by a separate dedicated processor (for example, the accelerator) than by the host processor used for general purposes based on the characteristics of operations of the neural network. Here, one or more processing elements (PEs) included in the accelerator, and an on-chip memory may be used. The on-chip memory may include, for example, a scratchpad memory accessible through an address space, a static random-access memory (SRAM), or the like.

The neural network may include a plurality of layers. In an example, the neural network may include an input layer, a plurality of hidden layers, and an output layer. Each of the layers may include a plurality of nodes each referred to as an artificial neuron. Each of the nodes may be used to perform an operation on at least one input to generate at least one output, and the nodes may be interconnected. A weight may be set for a connection between nodes and be adjusted or changed. The weight may increase, decrease, or maintain a related data value, thereby determining an influence of the data value on a final result. To each node included in the output layer, weighted inputs of nodes included in a previous layer may be input. A process in which weighted data is input from a layer to a subsequent layer of the layer may be referred to as propagation.

The data storage device may be a hardware device configured to store therein data and include, for example, a memory and a storage. The memory may be a hardware device configured to allow short-term data access and include, for example, a DRAM. The storage may be a hardware device configured to allow long-term data access and include, for example, a solid-state drive (SSD) and a hard disk drive (HDD). Data stored in the memory may be loaded based on an address of the data and then be processed in a corresponding processor or accelerator. In contrast, for data stored in the storage, data processing may be needed for the data to be processed in a corresponding processor or accelerator. The data storage device may store data to be used for neural network-based processing by the accelerator, and the data stored in the data storage device may be transferred to the accelerator through direct communication between extension boxes, without transferring through the host box 110, such that the electronic device 100 of one or more embodiments may effectively reduce the pressure on the host memory.

Although the extension boxes 120 are illustrated in FIG. 1 as including the same components for the convenience of description, components included in each extension box and the number thereof may vary according to an example, and the number of extension boxes included in the electronic device 100 may also vary according to an example.

Hereinafter, non-limiting examples of a single node-based electronic device of one or more embodiments (e.g., the single node-based electronic device 100) that may minimize constraints of expandability will be described in detail with the accompanying drawings.

Figure 2:
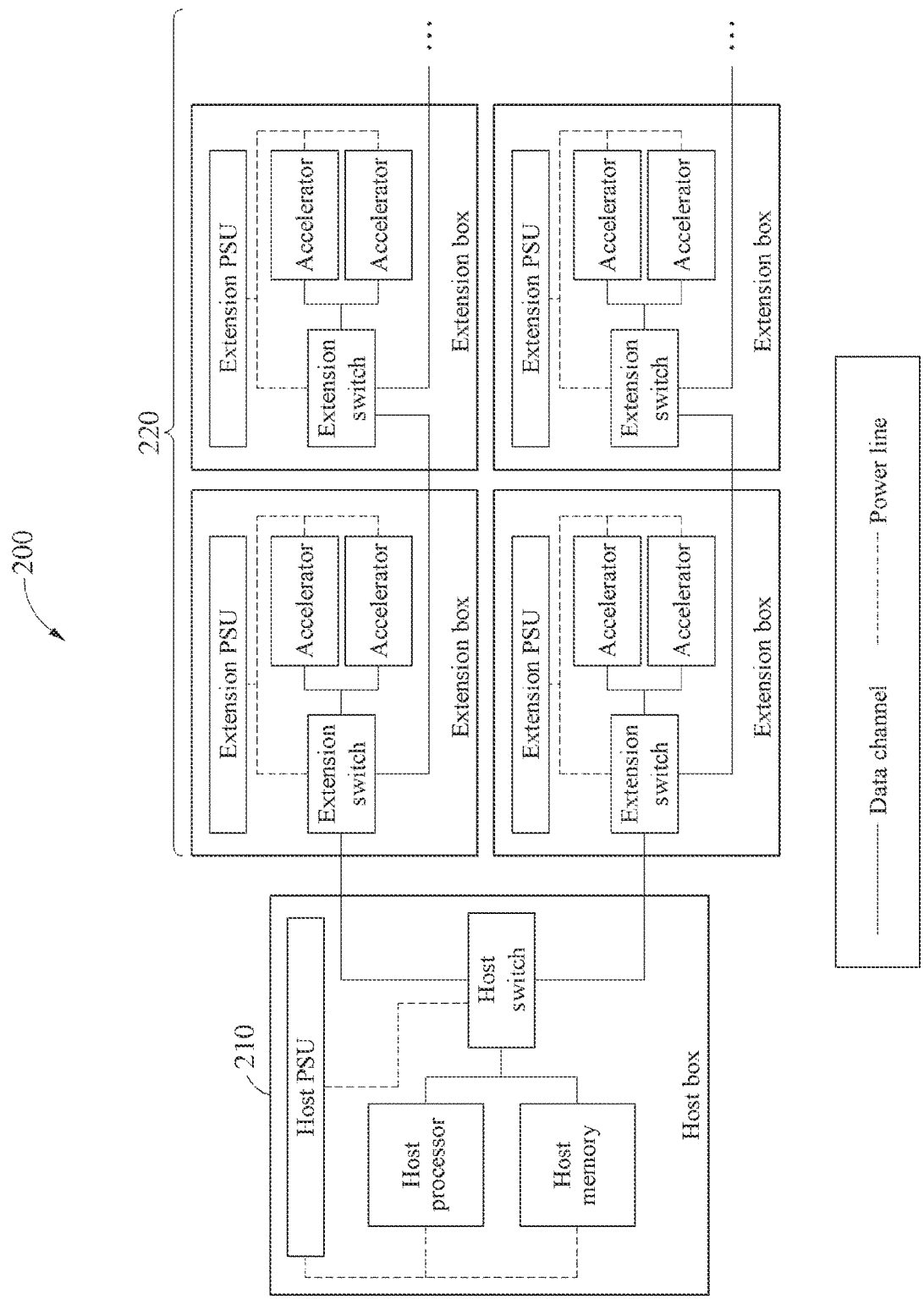
FIG. 2 illustrates an example of an extension box including an independent power supply unit (PSU) and motherboard.

FIG. 2 illustrates an example of an extension box including an independent PSU and motherboard.

Referring to FIG. 2, a host box 210 and one or more extension boxes 220 may include independent PSUs and motherboards, and thus the expandability of an electronic device 200 of one or more embodiments may not be restricted by the limited number of slots of the motherboards and by the limited power of the PSUs. A controller included in each of the extension boxes 220 is omitted from FIG. 2 for the convenience of description, and components included in each extension box and the number thereof may vary according to an example.

A host motherboard of the host box 210 may have a preset number of slots according to a construction and/or configuration, and thus the expandability of the host box 210 may be determined by the preset number of slots. However, through the extension boxes 220 having independent extension motherboards, the expandability of the electronic device 200 may not be restricted by the number of slots. That is, using the expandability of the number of devices supported by a tree topology may readily expand slots included in the electronic device 200. In addition, each of the extension boxes 220 may not include a separate host processor or a host memory, and thus the construction and/or configuration of an extension motherboard may be more simplified.

A host PSU of the host box 210 may supply power within a preset limit according to the construction and/or configuration, and thus the expandability of the host box 210 may be determined by the preset power limit. However, through the extension boxes 220 having independent PSUs, the expandability of the electronic device 200 may not be restricted by such power limit. In addition, each of the extension boxes 220 may include a separate PSU, and thus installation or management of the PSU may be more facilitated.

The host box 210 and the extension boxes 220 may be connected to neighboring extension boxes through switches, which may expand the electronic device 200 more freely. Thus, even when the performance for the electronic device 200 changes, the electronic device 200 of one or more embodiments that is suitable for the changed performance may be readily implemented by adding or removing an extension box by a switch thereof.

Figure 3:
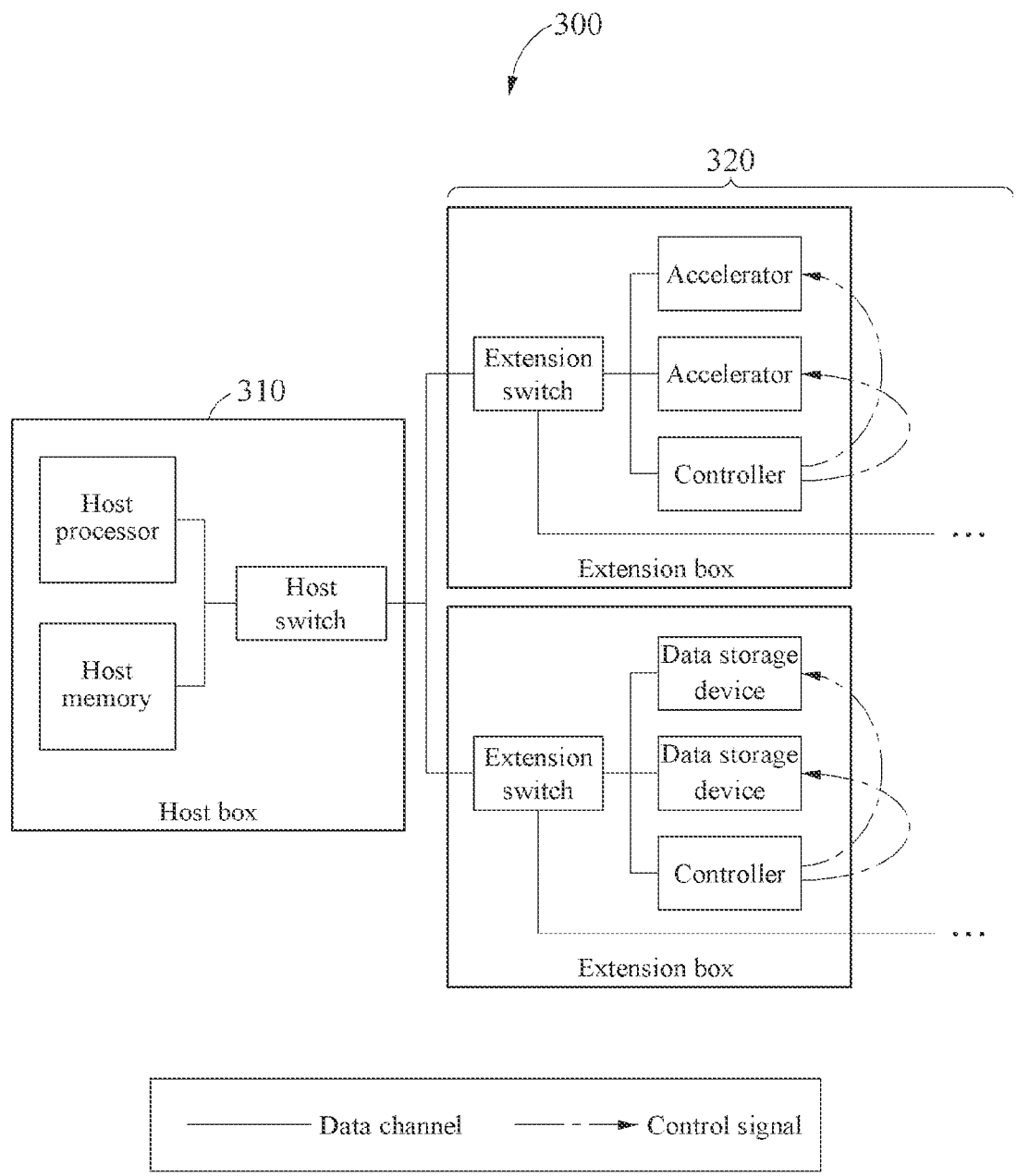
FIG. 3 illustrates an example of an extension box including a controller.

FIG. 3 illustrates an example of an extension box including a controller.

Referring to FIG. 3, each of one or more extension boxes 320 may include a controller independent of a host processor of a host box 310, and thus the expandability of an electronic device 300 may not be restricted by a performance limit of the host processor. A host PSU included in the host box 310 and an extension PSU included in each of the extension boxes 320 are omitted from FIG. 3 for the convenience of description, and components included in each extension box and the number thereof may vary according to an example.

A controller included in each of the extension boxes 320 may perform a basic operation and also control and/or manage operations of components included in a corresponding extension box. For example, the controller may be a device including a computation function that performs management of components (e.g., an accelerator, a data storage device, etc.) included in a corresponding extension box through a device driver, data management, data processing, or the like.

Thus, the expandability may not be restricted by the performance (e.g., the number of available CPU cores, etc.) of the host processor included in the host box 310, and the number of extension boxes to be included in the electronic device 300 may be increased as determined for a performance.

Figure 4:
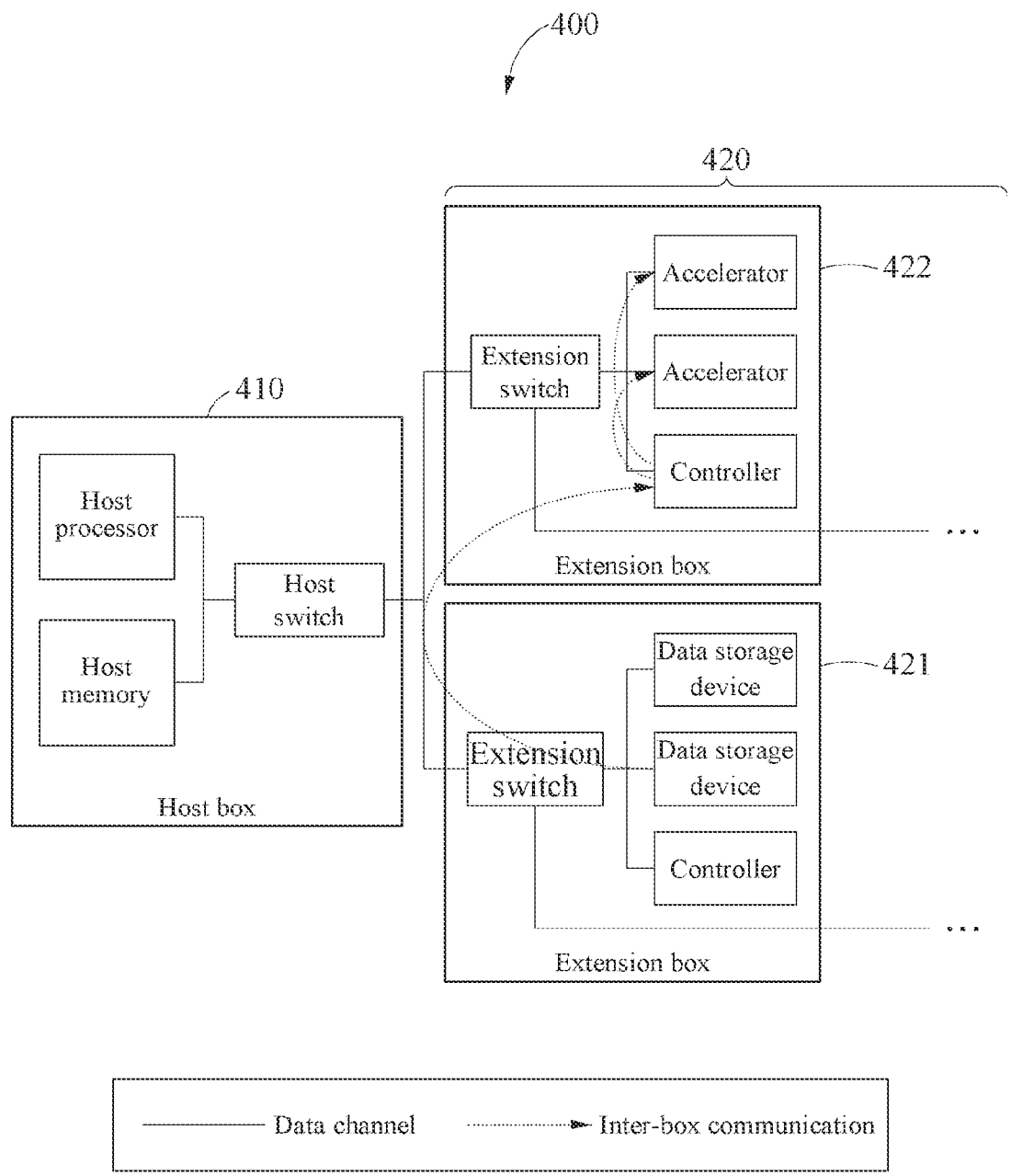
FIG. 4 illustrates an example of an extension box performing inter-device direct communication.

FIG. 4 illustrates an example of an extension box performing inter-device direct communication.

Referring to FIG. 4, one or more extension boxes 420 may directly communicate therebetween without communicating through a host box 410, and thus the expandability of an electronic device 400 may not be restricted by a host memory of the host box 410. A host PSU included in the host box 410 and an extension PSU included in each of the extension boxes 420 are omitted from FIG. 4 for the convenience of description, and components included in each extension box and the number thereof may vary according to an example.

For example, as illustrated, a first extension box 421 may include one or more data storage devices, and a second extension box 422 may include one or more accelerators. In a case in which data stored in the data storage devices of the first extension box 421 is transferred to the accelerators of the second extension box 422 to be processed in the accelerators, the data stored in the data storage devices of the first extension box 421 may be transferred to a controller of the second extension box 422, the controller may process the data to transfer the processed data to the accelerators, and the accelerators may then process the processed data transferred from the controller. Here, inter-box communication may be performed between the first extension box 421 and the second extension box 422, with the host memory of the host box 410 being excluded from a data path. Thus, the electronic device 400 of one or more embodiments may minimize a load of the host memory of the host box 410. In addition, through such inter-device direct communication, the data storage devices in the first extension box 421 may be used as a buffer, and thus the electronic device 400 of one or more embodiments may minimize the overhead of a buffer for performing data communication.

Figure 5:
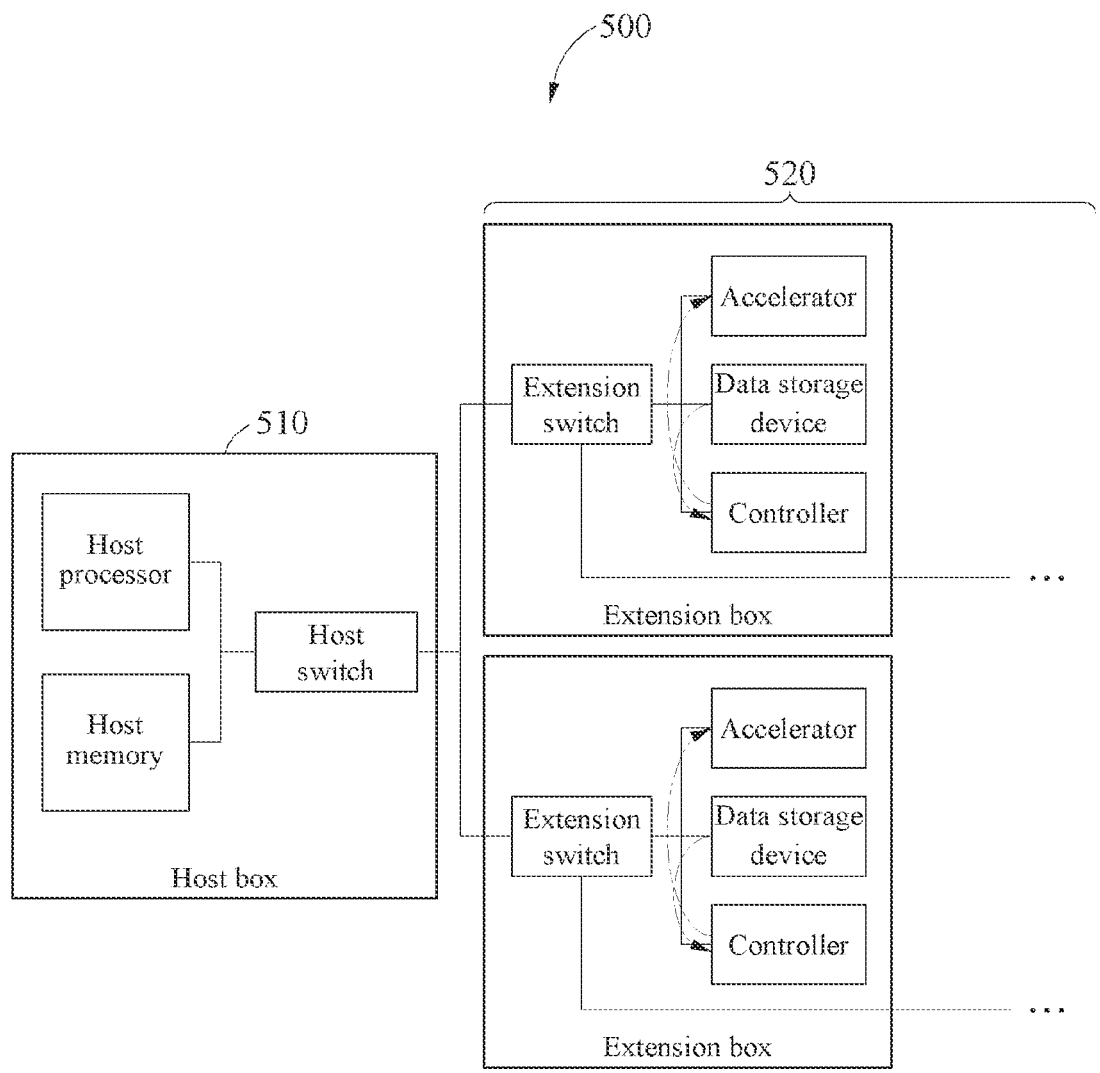
FIG. 5 illustrates an example of a component of an extension box.

FIG. 5 illustrates an example of a component of an extension box.

Referring to FIG. 5, components to be included in each of one or more extension boxes 520 may be determined based on one or a combination of a data communication pattern of a workload performed in an electronic device 500 and a bandwidth of an extension switch included in each of the extension boxes 520. A host PSU included in a host box 510 and an extension PSU included in each of the extension boxes 520 are omitted from FIG. 5 for the convenience of description, and components included in the extension boxes 520 and the number thereof may vary according to an example.

The components (e.g., an accelerator, a data storage device, etc.) included in each of the extension boxes 520 may be determined such that an inter-box communication load is minimized based on either one or both of the data communication pattern based on the workload and the bandwidth of the extension switch. For example, the components of the extension boxes 520 may be determined such that data that is to be processed in a certain accelerator is to be stored in a data storage device in the same extension box. In general, data processed in an accelerator is smaller in size than data yet to be processed in the accelerator. Thus, the components of the extension boxes 520 may be determined such that inevitable inter-box communication is performed on the data processed in the accelerator. In addition, the components of the extension boxes 520 may be determined such that the bandwidth of the extension switch maximally supports intra-box communication rather than inter-box communication.

The components of the extension boxes 520 included in the electronic device 500 or their connection structure may be determined based on one or a combination of two or more of the data communication pattern of the workload itself, a common performance metric representing processing performance of each device, and an actual hardware limitation. The data communication pattern may be connected from a storage in which data is stored, to a controller configured to process the stored data, and to an accelerator configured to process the processed data. The common performance metric may represent reading performance of the storage, data processing performance of the controller, and data processing performance of the accelerator, based on a sample or seconds. The components of the extension boxes 520 may be determined based on a ratio of the foregoing three performances represented by the common performance metric and a physical limitation of the extension boxes 520 (e.g., the maximum number of connectable components, etc.). For example, an extension box that performs neural network learning may be determined to include eight accelerators, two storages, and one controller.

The connection structure of the host box 510 and the extension boxes 520 may be a tree structure having the host box 510 as a root node. The tree structure may be based on, for example, a peripheral component interconnect (PCI) express (PCIe), a compute express link (CXL), or the like. The components of each of the extension boxes 520 may be determined such that data communication between different boxes is minimized and most data communication is performed within a box. An extension switch of each of the extension boxes 520 may fully support data communication between internal components. Thus, the electronic device 500 of one or more embodiments may implement localization of data communication and minimize a data communication load of a root node in a tree structure. Thus, the expandability of the electronic device 500 may not be restricted by a performance limitation of a data transfer network.

Figure 6:
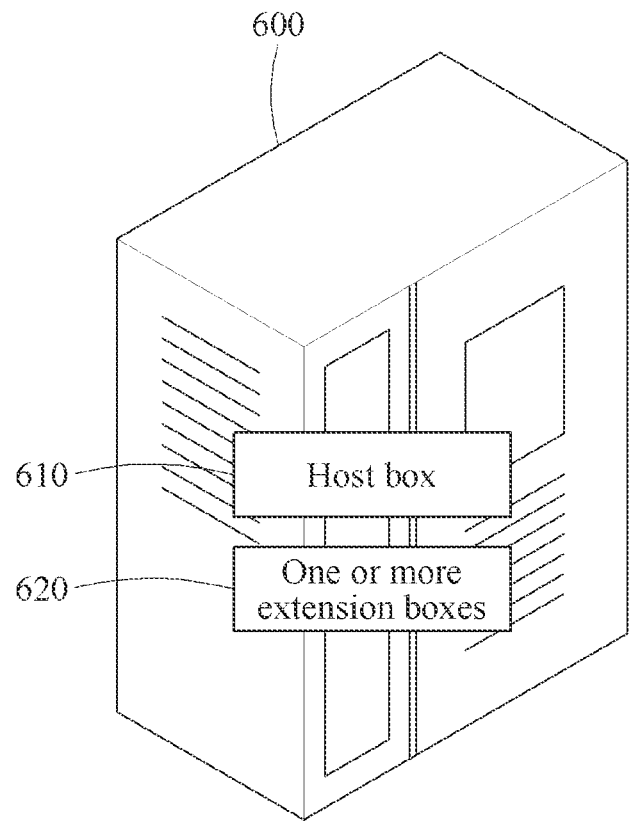
FIG. 6 illustrates an example of an electronic device.

FIG. 6 illustrates an example of an electronic device.

An electronic device described above (e.g., any or all of the electronic devices 100, 200, 300, 400 and 500) may be applicable to various fields of constructing a single system by connecting a plurality of nodes including operators and memory, for example, artificial intelligence using a plurality of hardware sets, a database, a storage system, and the like, and the performance thereof may be improved thereby.

Referring to FIG. 6, the electronic device may be embodied as a server 600. Although the electronic device is illustrated as the server 600 in FIG. 6 for the convenience of description, various examples of the electronic device, in addition to the server 600, may be applicable unrestrictedly.

The server 600 may include a host box 610 and one or more extension boxes 620.

The host box 6 may include a host processor configured to control or manage an operation of the server 600, a host motherboard in which the host processor is provided, and a host PSU configured to supply power to components connected to the host motherboard.

Each of the extension boxes 620 may include an extension motherboard independent of the host box 610, and an extension PSU independent of the host box 610 and configured to supply power to components connected to the extension motherboard.

Each of the extension boxes 620 may further include a controller independent of the host processor and configured to control operations of the components connected to the extension motherboard. The controller may perform one or a combination of two or more of device management based on a device driver of a corresponding extension box, input and output data management for a corresponding extension box, and processing of data stored in a storage.

In addition, at least one of the extension boxes 620 may further include a data storage device. Data stored in the data storage device may be transferred to an accelerator by a controller included in one of the extension boxes 620. The host memory included in the host box 610 may be excluded from a data transfer path.

In addition, each of the extension boxes 620 may further include an extension switch that communicates with the host box 610 and one or two or more of the extension boxes 620 that are disposed nearby. Components included in each of the extension boxes 620 may be determined based on one or a combination of a data communication pattern of a workload performed in the server 600 and a bandwidth of an extension switch included in each of the extension boxes 620. The data communication pattern may refer to a pattern in which data transferred from a storage is processed by a controller and is then transferred to an accelerator. A connection structure of the host box 610 and the extension boxes 620 may be a tree structure having the host box 610 as a root node. The components included in each of the extension boxes 620 may be determined based on one or a combination of two or more of reading performance of the storage, data processing performance of the controller, and processing performance of the accelerator, and on a physical limitation of a corresponding extension box.

For a more detailed description of the server 600, reference may be made to what has been described above with reference to FIGS. 1-5.

The electronic devices, host boxes, one or more extension boxes, first extension boxes, second extension boxes, servers, PSUs, processors, memories, switches, accelerators, data storage devices, controllers, electronic device 100, host box 110, one or more extension boxes 120, electronic device 200, host box 210, one or more extension boxes 220, electronic device 300, host box 310, one or more extension boxes 320, electronic device 400, host box 410, one or more extension boxes 420, first extension box 421, second extension box 422, electronic device 500, host box 510, one or more extension boxes 520, server 600, host box 610, one or more extension boxes 620, and other devices, apparatuses, units, modules, and components described herein with respect to FIGS. 1-6 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-6 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. An electronic device comprising:
a host box comprising:
a host processor configured to control an operation of the electronic device,
a host motherboard in which the host processor is disposed, and
a host power supply unit (PSU) configured to supply power to a component connected to the host motherboard; and
one or more extension boxes controlled by the host box, wherein each of the one or more extension boxes comprises:
an extension motherboard independent of the host box, wherein the extension mother board is disposed in a corresponding box, and
an extension PSU independent of the host box, wherein the extension PSU is disposed in the corresponding box and configured to supply power to a component connected to the extension motherboard.

2. The electronic device of claim 1, wherein each of the one or more extension boxes further comprises a controller independent of the host processor and configured to control an operation of the component connected to the extension motherboard.

3. The electronic device of claim 2, wherein the controller is configured to perform any one or any combination of any two or more of device management based on a device driver of a corresponding extension box, input and output data management for the corresponding extension box, and processing of data stored in a storage.

4. The electronic device of claim 1, wherein
at least one of the one or more extension boxes further comprises a data storage device, and
data stored in the data storage device is transferred to an accelerator comprised in the at least one of the one or more extension boxes by a controller comprised in the at least one of the one or more extension boxes.

5. The electronic device of claim 4, wherein a host memory comprised in the host box is excluded from a transfer path of the data.

6. The electronic device of claim 1, wherein each of the one or more extension boxes further comprises an extension switch configured to communicate with the host box and one or more of the one or more extension boxes disposed adjacent to the extension box among the one or more extension boxes.

7. The electronic device of claim 1, wherein a component comprised in each of the one or more extension boxes is determined based on either one or both of a data communication pattern of a workload performed in the electronic device and a bandwidth of an extension switch comprised in each of the one or more extension boxes.

8. The electronic device of claim 7, wherein the data communication pattern is a pattern in which data transferred from a storage is processed by a controller and is the processed data that is transferred to an accelerator.

9. The electronic device of claim 1, wherein a connection structure of the host box and the one or more extension boxes is a tree structure having the host box as a root node.

10. The electronic device of claim 1, wherein a component comprised in each of the one or more extension boxes is determined based on any one or any combination of any two or more of reading performance of a storage, data processing performance of a controller, and processing performance of an accelerator, and on a physical limitation of a corresponding extension box.

11. An electronic device comprising:
a host box comprising:
- a host processor configured to control an operation of the electronic device,
- a host motherboard in which the host processor is disposed, and
- a host power supply unit (PSU) configured to supply power to a component connected to the host motherboard; and one or more extension boxes controlled by the host box, wherein each of the one or more extension boxes comprises:
- an extension motherboard independent of the host box, wherein the extension mother board is disposed in a corresponding box, and
- a controller independent of the host processor and configured to control an operation of a component connected to the extension motherboard.

12. The electronic device of claim 11, wherein the controller is configured to perform any one or any combination of any two or more of device management based on a device driver of a corresponding extension box, input and output data management for the corresponding extension box, and processing of data stored in a storage.

13. The electronic device of claim 11, where each of the one or more extension boxes further comprises an extension PSU independent of the host box and configured to supply power to the component connected to the extension motherboard.

14. The electronic device of claim 11, wherein
at least one of the one or more extension boxes further comprises a data storage device, and
data stored in the data storage device is transferred to an accelerator comprised in the at least one of the one or more extension boxes by a controller comprised in the at least one of the one or more extension boxes.

15. The electronic device of claim 11, wherein each of the one or more extension boxes further comprises an extension switch configured to communicate with the host box and one or more of the one or more extension boxes disposed adjacent to the extension box among the one or more extension boxes.

16. The electronic device of claim 11, wherein a connection structure of the host box and the one or more extension boxes is a tree structure having the host box as a root node.

17. An electronic device comprising:
a host box comprising:
- a host processor configured to control an operation of the electronic device,
- a host motherboard in which the host processor is disposed, and
- a host power supply unit (PSU) configured to supply power to a component connected to the host motherboard; and one or more extension boxes controlled by the host box,
wherein at least one of the one or more extension boxes comprises a data storage device, and
wherein data stored in the data storage device is transferred to an accelerator comprised in the at least one of the one or more extension boxes by a controller comprised in the at least one of the one or more extension boxes.

18. The electronic device of claim 17, wherein each of the one or more extension boxes comprises:
- an extension motherboard independent of the host box; and
- an extension PSU independent of the host box and configured to supply power to a component connected to the extension motherboard.

19. The electronic device of claim 17, wherein the controller is independent of the host processor such that the controller is disposed in a corresponding extension box.

* * * * *